United States Patent [19]

Broussoux et al.

[11] Patent Number: 4,508,668

[45] Date of Patent: Apr. 2, 1985

[54] METHOD OF FABRICATION OF PIEZOELECTRIC POLYMER TRANSDUCERS BY FORGING

[75] Inventors: Dominique Broussoux; Hugues Facoetti; François Micheron, all of Paris, France

[73] Assignee: Thomson-CSF, Paris, France

[21] Appl. No.: 467,887

[22] Filed: Feb. 18, 1983

[30] Foreign Application Priority Data

Feb. 22, 1982 [FR] France ............................. 82 02876

[51] Int. Cl.³ .......................... B29D 7/24; H01G 7/02
[52] U.S. Cl. .................................... 264/22; 264/24; 264/104; 264/235; 264/235.8; 264/320; 264/346; 425/174.8 R
[58] Field of Search ............................ 264/22–27, 264/175, 280, 104, 235.8, 235, 346; 425/174.8 R, 174.8 E

[56] References Cited

U.S. PATENT DOCUMENTS

| 3,691,264 | 9/1972 | Asahina | 264/22 |
| 3,878,274 | 4/1975 | Murayama et al. | 264/104 |
| 4,241,128 | 12/1980 | Wang | 264/22 |
| 4,248,808 | 2/1981 | West | 264/22 |
| 4,349,502 | 9/1982 | Pac et al. | 264/22 |
| 4,384,394 | 5/1983 | Lemonon et al. | 264/22 |
| 4,390,674 | 6/1983 | Ward et al. | 264/22 |
| 4,403,382 | 9/1983 | Facoetti et al. | 264/22 |
| 4,427,609 | 1/1984 | Broussoux | 264/22 |

FOREIGN PATENT DOCUMENTS

| 53-29366 | 3/1978 | Japan | 264/104 |
| 7409611 | 1/1975 | Netherlands | 264/104 |
| 2070505A | 9/1981 | United Kingdom | 264/104 |

Primary Examiner—Jeffery Thurlow
Attorney, Agent, or Firm—Cushman, Darby & Cushman

[57] ABSTRACT

In a method of fabrication of piezoelectric polymer transducers by forging, a preform is subjected to flattening by compression in order to produce a radial orientation of the molecular chains constituting the polymer with respect to the center of pressure.

10 Claims, 7 Drawing Figures

METHOD OF FABRICATION OF PIEZOELECTRIC POLYMER TRANSDUCERS BY FORGING

This invention relates to a method of fabrication of piezoelectric transducers from a polymeric material.

In order to endow a film of polymeric material such as polyvinylidene fluoride ($PVF_2$) with piezoelectric properties, it is a known practice to stretch the film to a substantial length in order to convert a solid non-polar phase to a solid polar phase. When a film of this type has been subjected to stretching along one dimension and polarized by an electric field in a direction at right angles to the stretching axis, it exhibits highly anisotropic piezoelectric properties. In the case of devices such as piezoelectric microphones having edgeclamped plates, it is often necessary to provide films having radial symmetry of their piezoelectric properties. The film elements obtained by means of a uniaxial stretching technique are therefore not the most suitable for this purpose. It may be endeavored to reduce the anisotropy in the plane of the film by biaxial stretching. This method consists in stretching a film first in one direction and then in a direction at right angles to the first while taking steps to ensure that the film is stretched to exactly the same extent in both directions. However, the piezoelectric properties of a biaxially stretched film lack uniformity in directions located between the two stretching axes. In particular, the Young's modulus will have a minimum value along the lines bisecting the angles formed by the stretching axes.

In order to overcome these drawbacks, the invention proposes a method of fabrication of piezoelectric film elements by subjecting a preform to compression which ensures uniform elongation of the preform in all directions.

The invention is therefore directed to a method of fabrication of a wafer of piezoelectric polymeric material which has uniform piezoelectric properties with respect to one axis when they are measured with respect to said axis. Said wafer is obtained from at least one preform by increasing its transverse dimensions and by electric polarization by means of a field directed at right angles to its faces. In accordance with the invention, the elongation results from compression of said preform between two pressure plates having rigid faces in which the variations in relative spacing are the same at an equal distance from an axis of compression.

Other features of the invention will be more apparent upon consideration of the following description and accompanying drawings, wherein.

Figure 1:
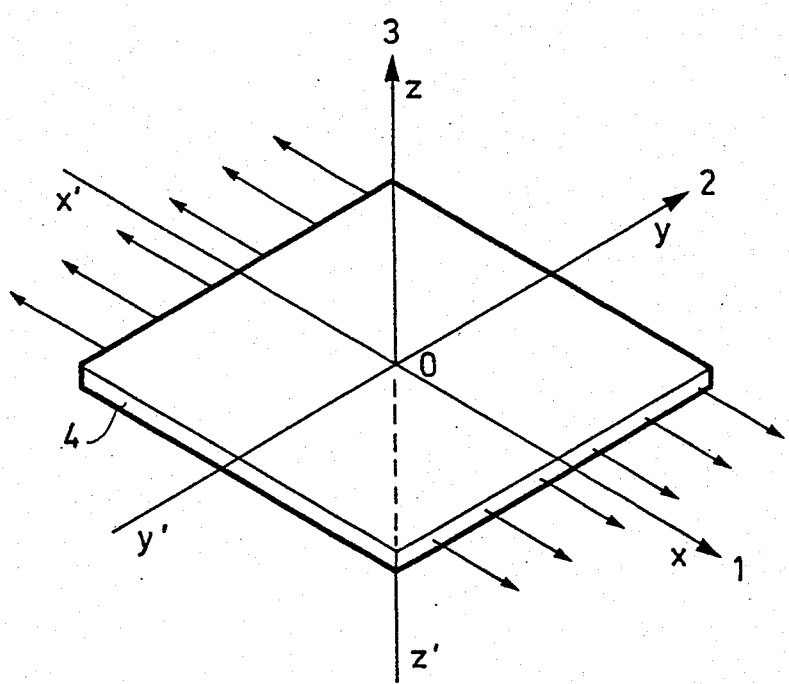
FIG. 1 is an isometric view of a film element of polymeric material.
Figure 2:
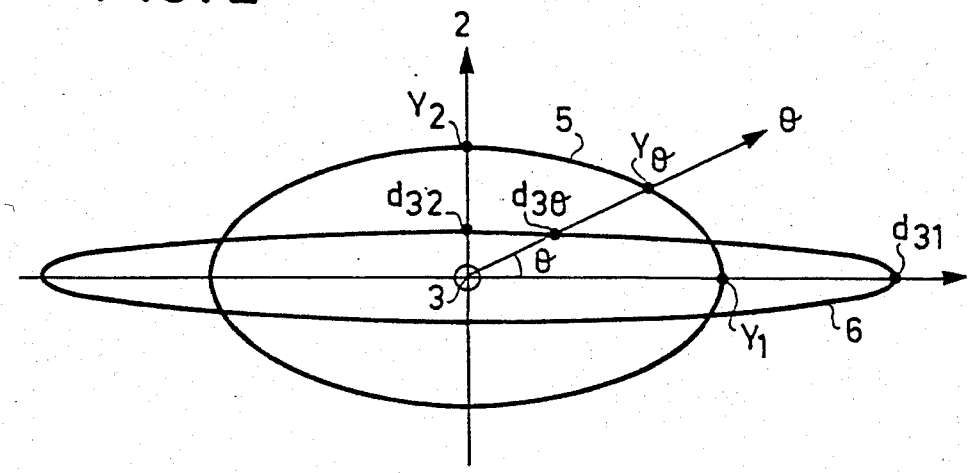
FIGS. 2 and 3 are explanatory diagrams.

FIG. 1 is an isometric view of a film element of polymeric material which is capable of acquiring piezoelectric properties. By way of example, polyvinylidene fluoride ($PVF_2$) is suitable for this purpose. The structure of $PVF_2$ is composed of spheroidal crystal masses contained in an amorphous phase and its macroscopic mechanical properties are those of an isotropic substance. The film element 4 consists of $PVF_2$ in $\alpha$-phase which is the phase corresponding to the product obtained from the molten polymer. The shape chosen for the film element is square in order to facilitate the interpretation of physical phenomena resulting from operations to which the film element is intended to be subjected. The letter O designates the geometrical center of the film element from which a system of orthonomic axes extends in the directions 1, 2 and 3 (x'-x, y'-y, z'-z) which are parallel to the sides of the film element. Said element is therefore a rectangular parallelepiped. A conventional means of producing a piezoelectric effect within the polymer consists in stretching the film in one direction, for example along the axis x'-x as indicated by the arrows and in applying an electric field to the film in a direction parallel to the axis z-z', whether simultaneously or not. The elongation as a result of stretching of the film may attain several times the initial length of this latter. The system of applied mechanical stresses produces a transformation from the non-polar $\alpha$-phase to a mechanically and electrically oriented polar $\beta$-phase. In order to be effective, the elongation must be irreversible and must be between 300 and 700%. This elongation can be obtained by means of a drawing machine or by calendering with melting and recrystallization. In both cases, the Young's modulus in the direction of stretching is of higher value than that measured in the other two directions and the elastic and piezoelectric properties are then highly anisotropic. Thus the Young's modulus $Y_1$ as measured along the stretching axis x'-x can be double the modulus $Y_2$ measured along the axis y-y' and the piezoelectric coefficient $d_{31}$ can be equal to ten times $d_{32}$. This is shown in FIG. 2 which is a diagram projected on a plane defined by the directions 1 and 2, direction 3 being located at right angles to said plane. Curve 5 represents the value of the Young's modulus $Y_\theta$ as measured in the plane xOy in the case of an angle $\theta$ with respect to the stretching direction. It is noted that $Y_1 = 2Y_2$. Curve 6 represents the value of the piezoelectric coefficient $d_{3\theta}$ in respect of a direction $\theta$. It is noted that $d_{31} = 10\ d_{32}$.

Figure 3:
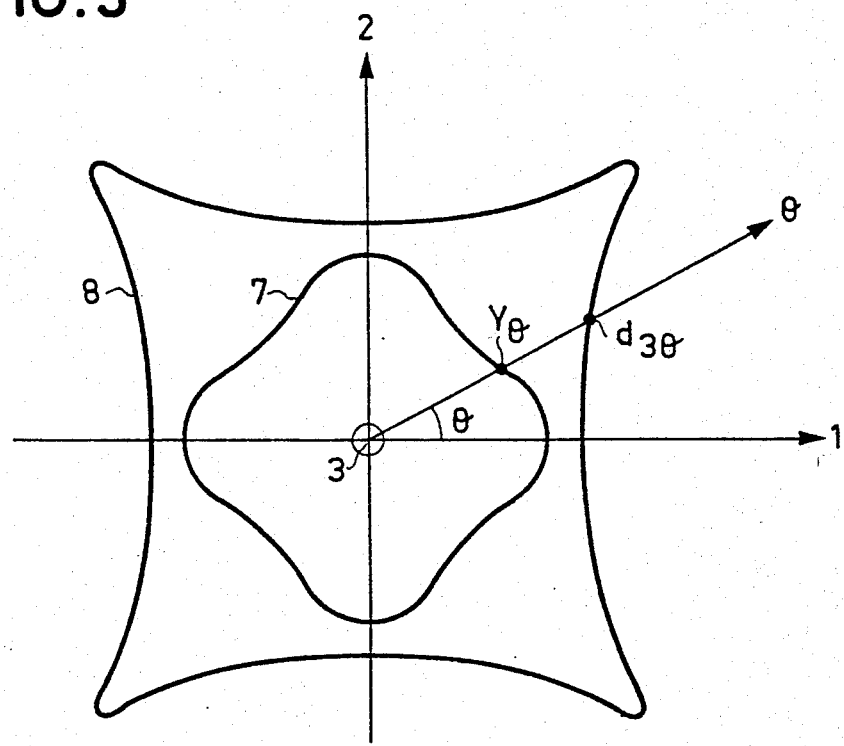

As stated earlier, it is possible to reduce the anisotropy in the plane of the film by biaxial stretching. For example, after the film has been stretched in the direction 1, stretching can be carried out in the direction 2 to an equal degree. The mechanical and piezoelectric parameters are accordingly modified as shown in FIG. 3. These parameters are identical in the plane of the film in both stretching directions. They remain dependent, however, on the direction which is comprised between these two axes of the plane and which is represented by the angle $\theta$. It is observed that the Young's modulus $Y_\theta$ which describes curve 7 is of maximum value along the stretching axes and of minimum value along the lines bisecting the angles defined by said axes. In contrast, the piezoelectric coefficient $d_{3\theta}$ is of minimum value in the stretching directions and of maximum value along the lines bisecting the angles defined by said axes. These relative variations according to the directions of the plane are usually smaller than or equal to 20%, which is acceptable for many applications in which resonances in transverse modes do not take place. Moreover, elements cut-out at random from a biaxially stretched film are similar in behavior on condition that steps have been taken to remove the edge portions of the film.

The major disadvantage of the biaxial stretching technology is its high cost. Furthermore, the defects in radial symmetry in the plane of the film have the effect of enhancing modes of vibration in dissymmetry sectors, thus producing objectionable parasitic resonance effects.

The method of transformation proposed in this patent Application consists in flattening an element of polymeric material by compression between pressure plates. At the time of compression of the polymer, the relative spacing of the pressure plates is the same at all points located on a circle centered on the axis of compression and located in a plane parallel to the pressure plates. The polymer undergoes a process of irreversible creep deformation which is guided between parallel planes. This forced creep deformation or so-called "forging" is carried out within a range of temperature and pressures which reduces the thickness of the forged element in a ratio withinn the range of 5 to 15, thereby producing an increase in surface area in the same ratio.

When this method is applied to a polymer such as $PVF_2$, this results in complete transition from the non-polar $\alpha$-phase to the polar $\beta$-phase. A typical example of an element to be forged consists of a preform resembling a disk having a diameter of 2.5 cm and a thickness of 3 mm. The disk is placed between the plates of a press, said plates being then heated to a temperature of 100° C. After balancing of the temperatures, a pressure of 20 T/cm$^2$ is applied to the disk for a period of five minutes. This corresponds to an initial rate of approach of the press-plates of approximately 1 mm per minute. At the end of the operation, the thickness of the sample obtained is then approximately 400 microns. Infrared analysis reveals that the transformation from the $\alpha$-phase to the $\beta$-phase is complete. A study of the morphology of the product obtained by light-diffusion at small angles indicates that the molecular chains constituting the polymer are oriented in the radial direction. The method consists in illuminating a small zone of the polymer with a polarized light beam and in observing the diffusion pattern obtained at the exit of an analyzer which is crossed with the direction of polarization of the incident beam. If the beam illuminates the center of the sample, there is observed a cross-shaped diffusion pattern which is characteristic of a radial distribution of the directions of the chains. If the beam illuminates a zone located at the edge of the sample, the diffusion pattern is on the contrary characteristic of an anisotropic distribution of the chains, the principal direction of which follows a radius of the sample.

The sample obtained in accordance with the method described in the foregoing is metallized on both faces by evaporation of aluminum. These metallization layers have a thickness of approximately 1000 Å. The metallized sample is then heated to a temperature of 80° C. and polarized at a voltage of 10 kV, which corresponds to an applied electric field of 250 kV/cm. The electric field is applied over a period of 30 minutes, whereupon the temperature is restored to a value corresponding to room temperature, also during a period of 30 minutes. The electric field continues to be applied during the temperature drop. The measured piezoelectric coefficient $d_{33}$ is approximately 6 pC.N$^{-1}$. This relatively low value can be explained by the fact that the applied electric field has a low value.

The saturation polarization ($P = 6 \times 10^{-2}$ C.m$^{-2}$) would have been obtained by means of an electric field of 1.5 MV/cm in the case of the same stresses exerted on the sample mentioned above; under these conditions, the piezoelectric coefficient $d_{33}$ would have attained approximately 25 pC.N$^{-1}$. This entails the need for a polarization voltage of the order of 60 kV which is difficult to apply in practice owing to the potential danger of arcover by insulation breakdown. In the method of fabrication, it is therefore preferable to associate the forging operation with electric polarization during deformation of the polymer. In fact, relatively weak electric fields (approximately 500 kV/cm) applied during transition from the $\alpha$-phase to the $\beta$-phase in the case of a $PVF_2$ polymer serve to obtain the electrically oriented $\beta$-phase. The explanation for this effect lies in the fact that the transition is accompanied by melting of the polymer in $\alpha$-phase followed by recrystallization in $\beta$-phase in the double field of mechanical and electrical stresses. As applied to the case of $PVF_2$, this technique has proved particularly effective since coefficients $d_{33}$ of the order of 20 to 22 pC.N$^{-1}$ have been obtained, thus indicating an approach to saturation of polarization.

Figure 4:
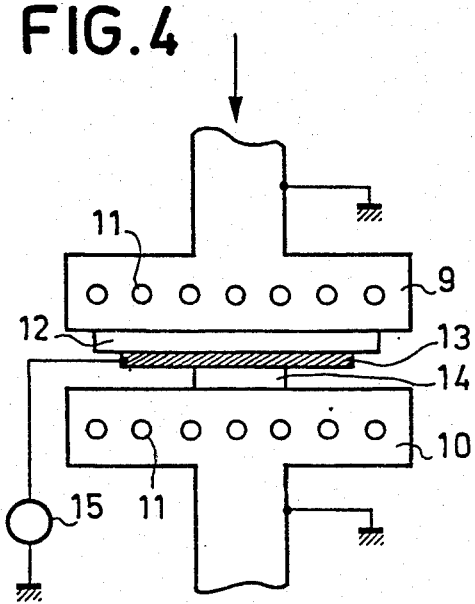
FIG. 4 illustrates a device for the practical application of the method in accordance with the invention.

One mode of execution is illustrated in FIG. 4 which represents a device for carrying out the method of fabrication of a piezoelectric wafer in accordance with the invention. There are shown in this figure two pressure plates 9 and 10 which are connected to ground and capable of heating a preform by passing an electric current through heating resistors 11. A polymer preform 14 of cylindrical shape and consisting of $PVF_2$, for example, is placed between the pressure plates. Prior to the pressing operation, a dielectric 12 is interposed for example between the top plate 9 and the disk 14. By way of example, said dielectric consists of an epoxy glass plate covered with a metallization layer 13 which is in contact with the polymer 14 and can consist of copper. This dielectric having a copper-coated face is therefore of the type employed for etching of printed circuits. The metallic layer 13 is connected to one pole of a high-voltage source 15, the other pole of which is connected to ground. The conditions of temperature and pressing are the same as those mentioned earlier and a voltage V=5 kV is applied. By means of this method, the tension which is applicable between the metallization layer 13 and the bottom plate of the press is 30 kV per centimeter of air-gap. This condition is essential in order to forestall any danger of arcing within the air-gap which exists between the bottom press-plate and the unmasked portion of the electrode 13 during the pressing operation. This voltage proves insufficient to polarize the polymer to saturation. However, when compression of the polymer has been completed, the air-gap formed between the electrode 13 and the press-plate 10 may be filled by reason of the increase in surface area of the polymer cylinder. This cylinder may then take up the entire surface area of the electrode 13, whereupon the polarization voltage can then be increased in values exceeding the flashover voltage of an air-gap of equal thickness.

Figure 5:
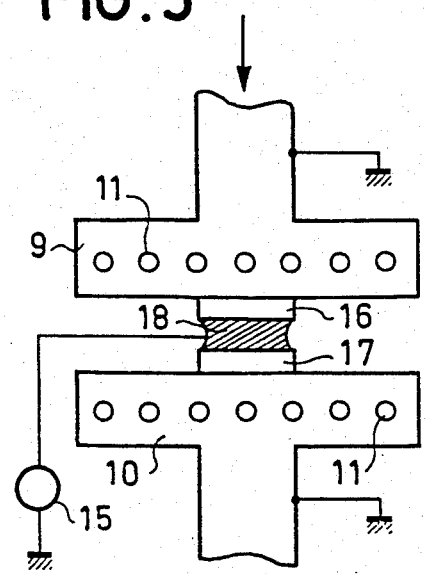
FIG. 5 illustrates an alternative embodiment of a device for the practical application of the method in accordance with the invention.

This procedure is partly equivalent to the method of polarization after deformation which is less effective than simultaneous deformation and polarization of a polymer. A better solution consists in providing a polarization electrode which is capable of undergoing creep deformation at the same time as the polymer cylinder and in the same ratio. This method is particularly advantageous when it is required to fabricate two piezoelectric wafers during the same operation by interposing the polarization electrode between the two polymer preforms to be processed. This method is illustrated in FIG. 5 which shows a device for simultaneous pressing and electric polarization.

The pressing machine which can be seen in this figure is of the same type as the machine shown in FIG. 4 and is mainly constituted by two pressure plates 9 and 10 having rigid conductive faces connected to ground potential. These pressure plates are heated by a system of heating resistors 11. The polymer preforms 16 and 17 to be processed are provided by way of example in the form of cylinders, one face of each cylinder being in contact with one of the plates. Said preforms are separated by an electrode 18 which is capable of undergoing creep deformation under the action of the pressure exerted by the plates 9 and 10. The electrode 18 is of polymer which has been made conductive by incorporation of conductive particles. These particles can be conductive carbon black representing approximately 20% of the volume of the electrode. A direct-current voltage generator 15 is connected between the electrode 18 and the pressure plates. By selecting for the electrode 18 a polymer which undergoes deformation in exactly the same manner as the cylinders to be forged, it will thus be possible to prevent any short-circuits between said electrode and one of the pressure plates as well as shrinkage of the polarization electrode with respect to the samples at the time of pressing. A simple solution consists in ensuring that the polymer which is chosen for the fabrication of the electrode is of the same type as the polymer of the cylinders and may accordingly consist of $PVF_2$, for example. Under the same operating conditions as before and in the case of an applied voltage of 25 kV throughout the operation, a piezoelectric coefficient of approximately 22 pC.N$^{-1}$ is obtained and is uniform in the plane of the two piezoelectric wafers thus obtained. An analysis of the dipole alignment ratio in $\beta$-phase shows that this latter attains 85%, namely a value which is close to saturation.

This method of conversion of $PVF_2$ polymer to the $\beta$-phase is particularly well-suited to rapid and economical production of circular plates having a radial distribution of chains. Plates of this type are wholly suited to the operation of transducers having symmetry of revolution such as piezoelectric microphones provided with edge-clamped plates as disclosed in patent Application No. 81.15 506 and filed by the present Applicant on August 11th, 1981. The method also permits the production of bimorph cells having radial symmetry; in this case the deformable intermediate electrode is obtained in accordance with the method which is described in patent Application No. 81.24 564 filed by the present Applicant on Dec. 31st, 1981 and which permits both bonding of two thin polymer plates to each other and simultaneous polarization of said plates.

Figure 6:
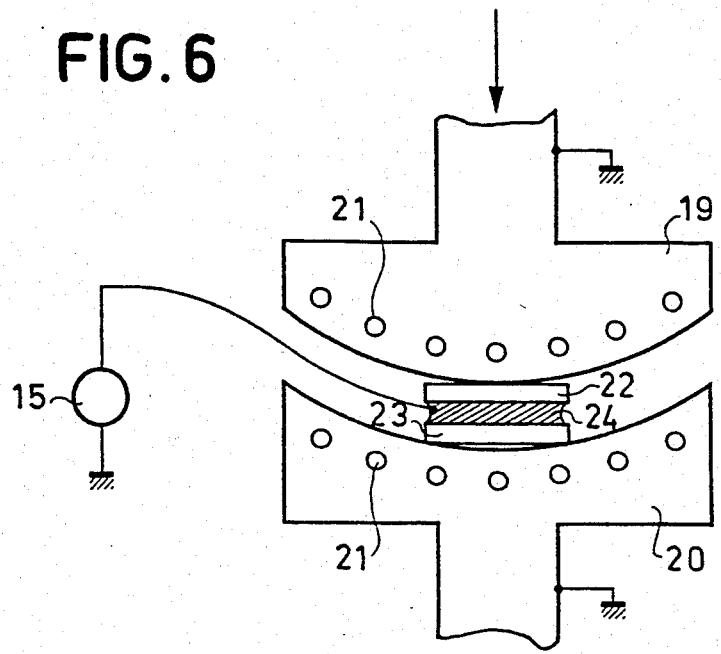
FIGS. 6 and 7 illustrate different steps of a method of fabrication in accordance with the invention.
Figure 7:
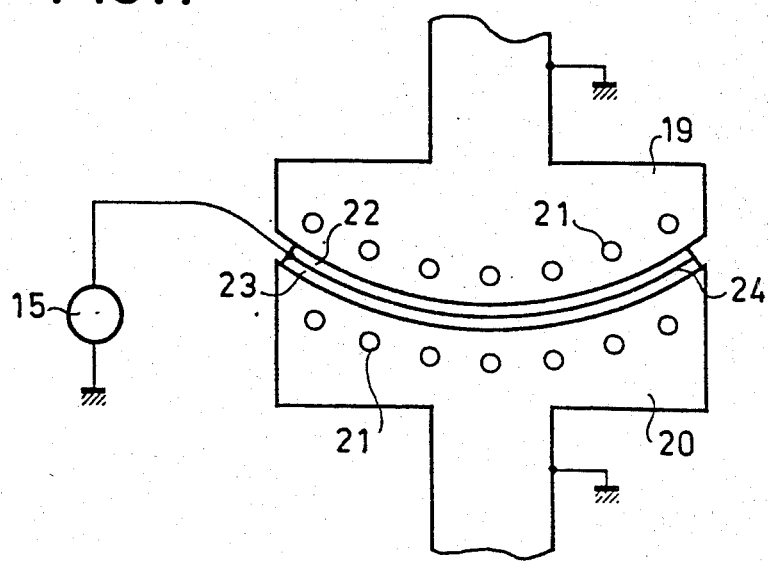

The method aforesaid can be extended to the production of non-flat shapes such as spherical cups or grooved surfaces produced by two complementary molds so that one surface forms raised portions whilst the other surface forms hollow portions. In this case, it is possible to start from flat cylinders. FIGS. 6 and 7 illustrate different stages of the method of fabrication. FIG. 6 illustrates the initial stage of the method. The polymer cylinders 22 and 23 are flat, their axes of revolution coincide with the axis of compression, and they are separated by the intermediate electrode 24 which is connected to one terminal of the direct-current voltage generator 15. The other terminal of the generator is at the same potential as the pressure plates 19 and 20. These plates have complementary shapes and, as shown in the example of FIGS. 6 and 7, are intended to produce objects in the shape of spherical cups. As in the previous example, these pressure plates can be heated by means of heating resistors 21. Pressing of the stack formed by the cylinders 22 and 23 and the electrode 24 which is advantageously chosen in the form of a disk as well as simultaneous polarization are carried out under conditions which are comparable with the preceding embodiments and make it possible to obtain cup-shaped products such as those shown in FIG. 7.

The general scope of the invention also includes the fabrication of piezoelectric transducers from a stack of more than two polymer preforms separated by polarization electrodes. Should requirements so dictate, these electrodes may serve to bond two wafers together. It would be necessary in such a case to ensure that the temperature to which the polymer cylinders are heated is uniform throughout all levels of the stack.

The invention is particularly well-suited to polar polymers such as polyvinylidene fluoride ($PVF_2$), its copolymers with polytetrafluoroethylene (PTFE), polytrifluoroethylene (PTrFE) and the compounds formed with polymethyl methacrylate (PMMA). The invention may also be used for fabricating bimorph polymer transducers. Devices having either a flat or curved shape can be obtained.

In order to ensure that these piezoelectric polymers have dimensional stability in time and at higher temperatures than those for which they have been prepared and also in order to guarantee stable piezoelectric activity, they can be annealed under a press at a temperature within the range of 100° C. to 110° C. for a length of time which is variable from 20 minutes to 1 hour. The resultant shrinkage is of the order of a few units percent and the piezoelectric activity decreases from 10 to 30% but stability is thus ensured up to an operating temperature in the vicinity of the annealing temperature.

The invention relates to all fields of application of piezoelectricity and pyroelectricity including in particular electrostatic devices and bimorph transducers.

What is claimed is:

1. A method of fabrication of a wafer of piezoelectric polymeric material which has uniform piezoelectric properties with respect to one axis when they are measured with respect to said axis, said wafer being obtained from at least one preform by increasing its transverse dimensions and by electric polarization by means of a field directed at right angles to its faces, wherein the elongation results from compression of said preform between two pressure plates having rigid faces continuously contacting said film during compressing, so that the distance between the ends of said film is increased, the variations in relative spacing of the plates being the same at an equal distance from an axis of compression.

2. A method of fabrication according to claim 1, wherein said compression is performed in the hot state.

3. A method of fabrication according to claim 1, wherein said compression and electric polarization are performed simultaneously.

4. A method of fabrication according to claim 1, wherein said preform has the appearance of a cylinder whose axis is located in the axis of compression.

5. A method of fabrication according to claim 1, wherein said polarization is applied to said preform by means of at least one polarization electrode.

6. A method of fabrication according to claim 5, wherein said electrode is capable of undergoing creep deformation during said compression operation while retaining its electrical properties.

7. A method of fabrication according to claim 1, wherein a plurality of piezoelectric polymer wafers are fabricated during the same operation from a corresponding number of preforms which are separated from each other by a polarization electrode.

8. A method of fabrication according to claim 6, wherein said polarization electrode is intended to constitute the intermediate electrode of a bimorph transducer while serving as a binder between two polymer film elements.

9. A method of fabrication according to claim 1, wherein said pressure plates serve to shape said wafer.

10. A method of fabrication according to claim 1, wherein said wafer has been subjected to an annealing operation in order to ensure dimensional stabilization of said wafer with respect to time.

* * * * *